(12) United States Patent
Lin et al.

(10) Patent No.: US 8,053,323 B1
(45) Date of Patent: Nov. 8, 2011

(54) PATTERNING METHODOLOGY FOR UNIFORMITY CONTROL

(75) Inventors: Yu Chao Lin, Rende Township, Tainan County (TW); Ming-Ching Chang, Hsinchu (TW); Yih-Ann Lin, Jhudong Township, Hsinchu County (TW); Ryan Chia-Jen Chen, Chiayi (TW); Chao-Cheng Chen, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/938,571

(22) Filed: Nov. 3, 2010

(51) Int. Cl.
*H01L 21/336* (2006.01)
(52) U.S. Cl. ........................ 438/303; 438/618
(58) Field of Classification Search .................. 438/303
See application file for complete search history.

(56) References Cited

U.S. PATENT DOCUMENTS

| | | | | |
|---|---|---|---|---|
| 5,981,368 A | * | 11/1999 | Gardner et al. | 438/595 |
| 6,191,044 B1 | * | 2/2001 | Yu et al. | 438/713 |
| 2003/0211684 A1 | * | 11/2003 | Guo | 438/230 |
| 2010/0108264 A1 | * | 5/2010 | Delgadino et al. | 156/345.35 |

* cited by examiner

*Primary Examiner* — Thao P. Le
(74) *Attorney, Agent, or Firm* — Haynes and Boone, LLP

(57) ABSTRACT

The present disclosure provides a method of fabricating a semiconductor device. The method includes forming a patternable layer over a substrate. The method includes forming a first layer over the patternable layer. The method includes forming a second layer over the first layer. The second layer is substantially thinner than the first layer. The method includes patterning the second layer with a photoresist material through a first etching process to form a patterned second layer. The method includes patterning the first layer with the patterned second layer through a second etching process to form a patterned first layer. The first and second layers have substantially different etching rates during the second etching process. The method includes patterning the patternable layer with the patterned first layer through a third etching process.

20 Claims, 10 Drawing Sheets

PATTERNING METHODOLOGY FOR UNIFORMITY CONTROL

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreased geometry size leads to challenges in fabrication. For example, as geometry sizes continue to decrease, it is more difficult to achieve critical dimension (CD) uniformity for semiconductor devices. For example, poor CD uniformity may be a result of variations in topography. Poor CD uniformity may lead to undesirable drifting of drain currents and threshold voltages of transistors. Traditionally, when geometry sizes are relatively large, the topography variations may have a negligible effect on the CD uniformity. However, as geometry sizes become smaller and smaller, even slight variations in topography may have a detrimental effect on CD uniformity. Furthermore, to a semiconductor foundry, it may need to interact with multiple customers whose devices each have their own unique topography. Consequently, the CD uniformity issue may be more pronounced for the semiconductor foundry.

Traditional fabrication method of controlling CD uniformity are expensive and tend to suffer from undesired lateral etching problems which may limit the effectiveness of the CD uniformity control. Therefore, while traditional methods of CD uniformity control have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
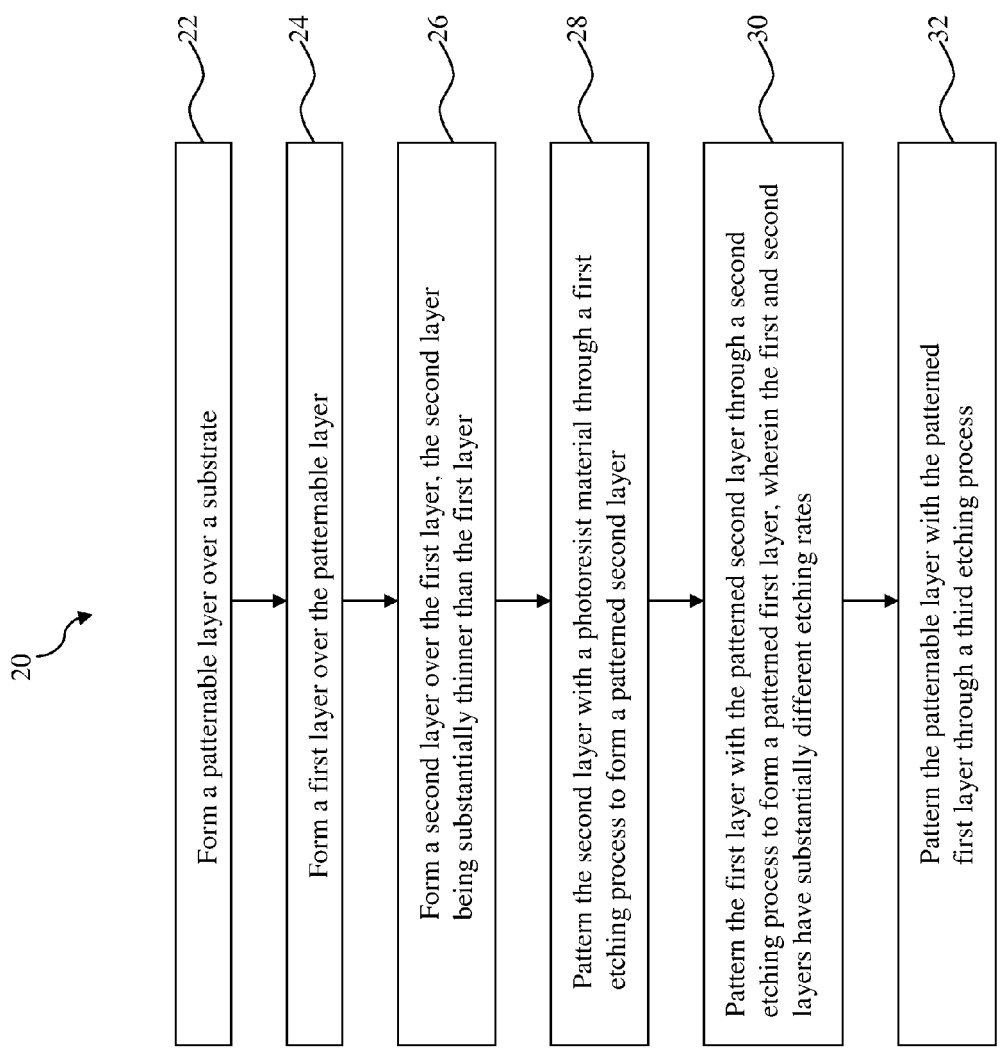
FIG. 1 is a flowchart illustrating a method of controlling critical dimension uniformity of a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 20 for fabricating a semiconductor device. The method 20 begins with block 22 in which a patternable layer is formed over a substrate. The method 20 continues with block 24 in which a first layer is formed over the patternable layer. The method 20 continues with block 26 in which a second layer is formed over the first layer. The second layer is substantially thinner than the first layer. The method 20 continues with block 28 in which the second layer is patterned with a photoresist material through a first etching process to form a patterned second layer. The method 20 continues with block 30 in which the first layer is patterned with the patterned second layer through a second etching process to form a patterned first layer. The first and second layers have substantially different etching rates during the second etching process. The method 20 continues with block 32 in which the patternable layer is patterned with the patterned first layer through a third etching process.

FIGS. 2-10 are diagrammatic fragmentary cross-sectional side views of a semiconductor device 40 at various stages of fabrication in accordance with various aspects of the present disclosure. It is understood that FIGS. 2-10 have been simplified for a better understanding of the inventive concepts of the present disclosure. Accordingly, it should be noted that additional processes may be provided before, during, and after the processes shown in FIGS. 2-10, and that some other processes may only be briefly described herein.

Figure 2:
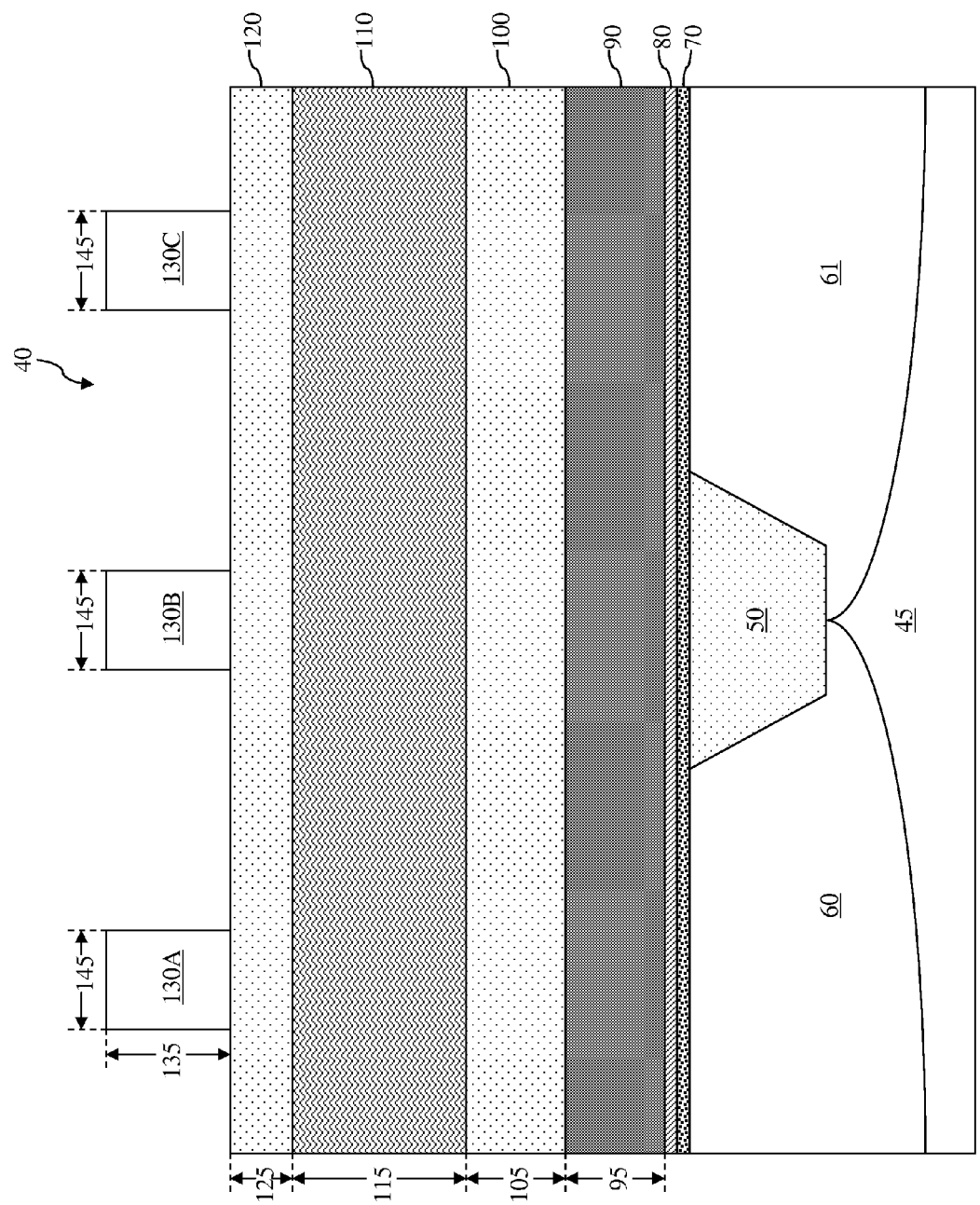
FIGS. 2-10 are diagrammatic fragmentary cross-sectional side views of a semiconductor device at various stages of fabrication in accordance with various aspects of the present disclosure.

Referring to FIG. 2, the semiconductor device 40 is a semiconductor IC chip, of which only a portion is shown here. The semiconductor device 40 includes a substrate 45. In the embodiment shown, the substrate 45 is a silicon substrate that is doped with a P-type dopant such as boron. In another embodiment, the substrate 45 is a silicon substrate that is doped with an N-type dopant such as arsenic or phosphorous.

Isolation structures such as isolation structure 50 are formed in the substrate 45. The isolation structure 50 includes a shallow trench isolation (STI) device. The STI device has a dielectric material, which may be silicon oxide or silicon nitride. The STI device is formed by etching a trench in the substrate 45 and thereafter filling the trench with the dielectric material. The formation of the isolation structure 50 may result in unevenness or variations of the topography on the surface of the substrate 45. In addition, the topography on the surface of the substrate 45 may vary for other reasons, such as imperfections related to other fabrication processes, and/or variations associated with different product patterns from different customers. For the sake of simplicity, these variations in the topography of the substrate surface are not explicitly shown in FIG. 2 or the subsequent figures, but it is understood that these topography variations exist.

Doped wells such as doped wells 60 and 61 are also formed in the substrate 45. The doped wells 60-61 are formed on either side of the isolation structure 50. In the embodiment shown in FIG. 2, the doped wells 60-61 are doped with an N-type dopant such as arsenic or phosphorous. In another embodiment, the doped wells 60-61 may be doped with a P-type dopant. The doping may be carried out using an ion implantation process known in the art.

A high-k dielectric layer 70 is formed over the substrate 45. The high-k dielectric layer 70 is formed using a deposition process known in the art, for example by an atomic layer deposition (ALD) process. The high-k dielectric layer 70 includes a high-k dielectric material. A high-k dielectric material is a material having a dielectric constant that is greater than a dielectric constant of $SiO_2$, which is approximately 4. For example, the high-k dielectric material may include hafnium oxide ($HfO_2$), which has a dielectric constant that is in a range from approximately 18 to approximately 40. Alternatively, the high-k material may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

The high-k dielectric layer 70 will serve as a gate dielectric for a transistor to be formed later. In an embodiment, the high-k dielectric layer 70 has a thickness that is in a range from about 5 angstroms to about 30 angstroms. It is understood that the thickness of the dielectric layer 70 may be in a different range in alternative embodiments.

A conductive layer 80 is formed over the high-k dielectric layer 70. The conductive layer 80 is formed by a deposition process known in the art such as an ALD process. The conductive layer 80 may serve as a capping layer for the high-k dielectric layer 70. In an embodiment, the conductive layer 80 includes a metal material, for example titanium nitride, and has a thickness that is in a range from about 20 angstroms to about 60 angstroms. It is understood that the thickness of the conductive layer 80 may be in a different range in alternative embodiments.

A polysilicon layer 90 is formed over the conductive layer 80. The polysilicon layer 90 is formed by a deposition process known in the art, such as an ALD process, a chemical vapor deposition (CVD) process, a physical vapor deposition (PVD) process, or combinations thereof. The polysilicon layer 90 will be patterned later into different polysilicon portions, where each polysilicon portion will serve as a dummy gate electrode in a gate-last or gate-replacement process. This will be discussed in more detail later. In an embodiment, the polysilicon layer 90 has a thickness 95 that is in a range from about 700 angstroms to about 1200 angstroms.

A hard mask layer 100 is formed over the polysilicon layer 90. The hard mask layer 100 will serve as a mask for the polysilicon layer 90 below when the polysilicon layer 90 is etched into dummy polysilicon gate electrodes in the later process. In an embodiment, the hard mask layer 100 includes a silicon nitride layer and a silicon oxide layer formed over the silicon nitride layer. Both the silicon nitride layer and the silicon oxide layer can be formed by CVD, PVD, ALD, or combinations thereof. The silicon nitride layer has a thickness that is in a range from about 50 angstroms to about 150 angstroms. The silicon oxide layer has a thickness that is in a range from about 700 angstroms to about 1100 angstroms. Thus, in that embodiment, the hard mask layer 100 has a thickness 105 (which is the sum of the thicknesses of the silicon nitride layer and the silicon oxide layer) that is in a range from about 750 angstroms to about 1250 angstroms. It is understood that the thickness of the hard mask layer 100 may be in a different range in alternative embodiments.

An anti-reflective layer 110 is formed over the hard mask layer 100. The anti-reflective layer 110 may also be referred to as a bottom anti-reflective coating (BARC) layer. The anti-reflective layer 110 is formed by a spin-coating process known in the art. In an embodiment, the anti-reflective layer 110 has a thickness 115 that is in a range from about 1000 angstroms to about 2000 angstroms, which is much thicker than other anti-reflective layers used in traditional semiconductor fabrication processes.

The anti-reflective layer 110 may be a naphthalene type or Aromatic type polymer. The anti-reflective layer 110 has a relatively high carbon concentration and a relatively low hydrogen concentration (both measured in terms of weight). The carbon concentration is at least an order of magnitude (10 times) greater than the hydrogen concentration. The anti-reflective layer 110 also has a relatively high refractive index (N) and a relatively low extinction coefficient (K). The refractive index may be greater than about 1, and the extinction coefficient may be lower than about 0.5.

In one embodiment, the anti-reflective layer 110 includes a material that has a carbon concentration in a range from about 65% to about 70%, a hydrogen concentration in a range from about 5.5% to about 6.5%, a molecular weight in a range from about 3500 mw to about 4500 mw, a refractive index in a range from about 1.6 to about 1.7, and an extinction coefficient in a range from about 0.2 to about 0.3, where both the refractive index and the extinction coefficient are measured with respect to a 193 nanometer (nm) fabrication process.

In another embodiment, the anti-reflective layer 110 includes a material that has a carbon concentration in a range from about 80% to about 85%, a hydrogen concentration in a range from about 3% to about 5%, a molecular weight in a range from about 4500 mw to about 5500 mw, a refractive index in a range from about 1.4 to about 1.6, and an extinction coefficient in a range from about 0.3 to about 0.4, where both the refractive index and the extinction coefficient are measured with respect to the 193 nm fabrication process.

In other alternative embodiments, the anti-reflective layer 110 may include I-line photoresist or some other type of photoresist.

The anti-reflective layer 110 serves to reduce the reflection of light in a patterning process, for example through absorption. The reduction of reflected light helps improves the patterning performance. According to the present disclosure, the anti-reflective layer 110 is also formed to be thick for purposes of diluting topography variation effects. As discussed earlier, due to various fabrication process imperfections as well as different product patterns from different customers, the surface topography of the substrate 45 may be uneven and may have various concave and convex portions. For example, one region of the substrate 45 (such as the isolation structure 50) may protrude outward and be higher than the rest of the substrate 45. The various layers 70-100 formed over the substrate 45 thereafter are formed in a conformal manner. Hence, the topography variations of the substrate 45 will be "inherited" by the layers 70-100 formed above, which will also exhibit similar topography variations. These topography variations may result in critical dimension (CD) uniformity issues later on, and as such are undesirable.

Here, the anti-reflective layer 110 is formed to be thick so as to reduce the harmful effects of the topography variations. This is because the topography variations become smaller in relative terms as the anti-reflective layer 110 becomes thicker. For example, one type of topography variation is a step height, which measures the amount of protrusion of an STI device (for example the STI device of the isolation structure 50) over a substrate. For the sake of providing an example, a typical step height may be about 100 angstroms. A traditional anti-reflective layer may have a thickness that is about 400-500 angstroms. Therefore, a ratio range of the step height to the traditional anti-reflective layer is from about 1:4 to about 1:5.

Here, the thickness 115 of the anti-reflective layer 110 is in a range from about 1000 to about 2000 angstroms. Accordingly, the ratio of the step height to the anti-reflective layer 110 is from about 1:10 to about 1:20, which is much better than the traditional ratio range. The relative reduction of the step height with respect to the anti-reflective layer 110 means that the harmful effects caused by topography variations are diluted. And since the anti-reflective layer 110 is formed by a spin-coating process—which is not a conformal process—its top surface is substantially flat. So future layers formed over the anti-reflective layer 110 will not have substantial topography variations.

A sacrificial layer 120 is formed over the anti-reflective layer 110. The sacrificial layer 120 may also be referred to as a middle layer. The sacrificial layer 120 is formed by CVD, PVD, ALD, or combinations thereof. The sacrificial layer 120 has a thickness 125. In one embodiment, the sacrificial layer 120 includes a thin dielectric material. The dielectric material may be Tetraethyl orthosilicate (TEOS) and may contain some organic material. The dielectric material has to be thin enough for proper exposure during photolithography. Thus, the thickness 125 of the sacrificial layer 120 is in a range from about 50 angstroms to about 200 angstroms when it includes dielectric.

In another embodiment, the sacrificial layer 120 includes an organic material (such as a photoresist material) that is doped with nitrogen. In that case, the sacrificial layer 120 can be much thicker, and the thickness 125 may be in a range from about 400 angstroms to about 500 angstroms. In other alternative embodiments, the sacrificial layer 120 may include polysilicon or an organic material doped with silicon.

The sacrificial layer 120 will be patterned into different portions in a later process, where each portion will be used as a mask for patterning the layers below. In other words, the sacrificial layer 120 will "fix" the CD size of a transistor device. This will be discussed in more detail below. The sacrificial layer 120 will also have very high etching selectivity with the anti-reflective layer 110 when the anti-reflective layer 110 is etched, so that the fixed CD size may be maintained during the etching.

A patterned photoresist layer 130 is formed over the sacrificial layer 120. The patterned photoresist layer 130 includes a plurality of photoresist portions 130A, 130B, and 130C. These photoresist portions 130A-130C are formed by depositing a photoresist layer (for example through a spin-coating process) over the sacrificial layer 120 and then patterning the photoresist layer with a photolithography process known in the art, which may include one or more masking, exposing, baking, developing, and rinsing processes (not necessarily in that order).

The photoresist portions 130A-130C each have a thickness 135 that is in a range from about 800 angstroms to about 1500 angstroms. The photoresist portions 130A-130C also each have a width (lateral dimension) 145. The width 145 is set to be approximately equal to the desired CD of a transistor device. As an example, the CD of a transistor device may be its conductive channel length, which is approximately the width of its gate.

Figure 3:
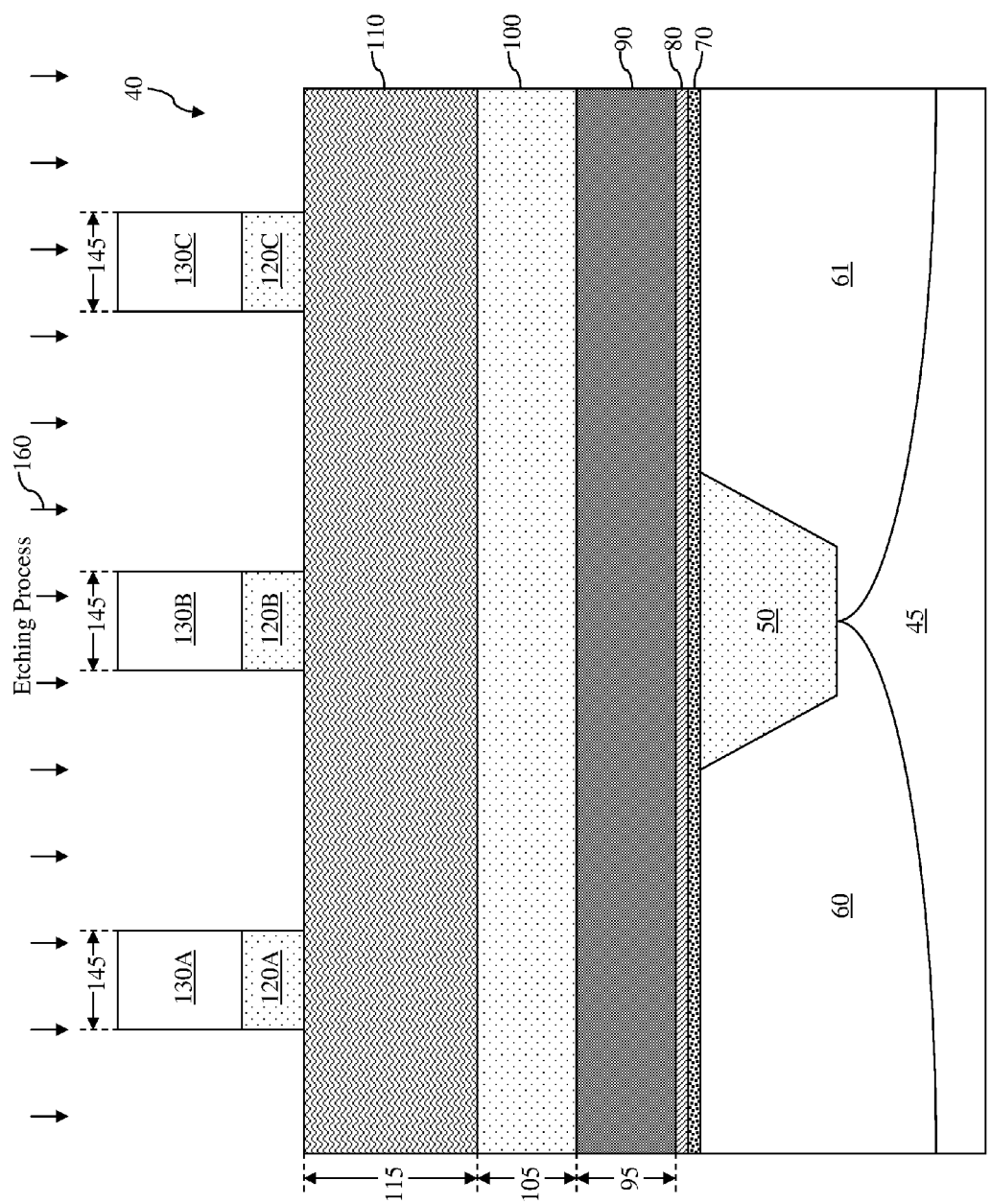

Referring now to FIG. 3, an etching process 160 (also referred to as a patterning process) is performed on the semiconductor device 40. The etching process 160 is a dry etching process and uses a fluorine-containing plasma as an etchant. In an embodiment, the etchant includes $CF_4$ or $CH_2F_2$, or a combination thereof. A helium gas may be used as a carrying gas. The etching process 160 may have a process flow rate in a range from about 10 standard cubic centimeter per minute (sccm) to about 200 sccm. The etching process 160 may also have a process pressure in a range from about 1 mili Torr (mT) to about 10 mT, and a process power in a range from about 10 Watts to about 1000 Watts.

The photoresist portions 130A-130C serve as etching masks during the etching process 160, and unprotected portions of the sacrificial layer 120 are etched away. The remaining portions of the sacrificial layer 120 now become sacrificial components 120A, 120B, and 120C. The sacrificial components 120A-120C have substantially the same width 145 as the photoresist portions 130A-130C above.

In the embodiment where the sacrificial layer 120 includes a thin dielectric material, a trimming process may be optionally performed to the sacrificial components 120A-120C to fine tune their width 145. The trimming process may include an additional etching process to further shrink the width 145. In any case, the CD of the transistor device is substantially fixed at this stage, which is equal to the width 145. Therefore, it may be said that one of the functions of the sacrificial layer 120 is that it defines the CD of a transistor, or that it is a CD-defining layer.

Figure 4:
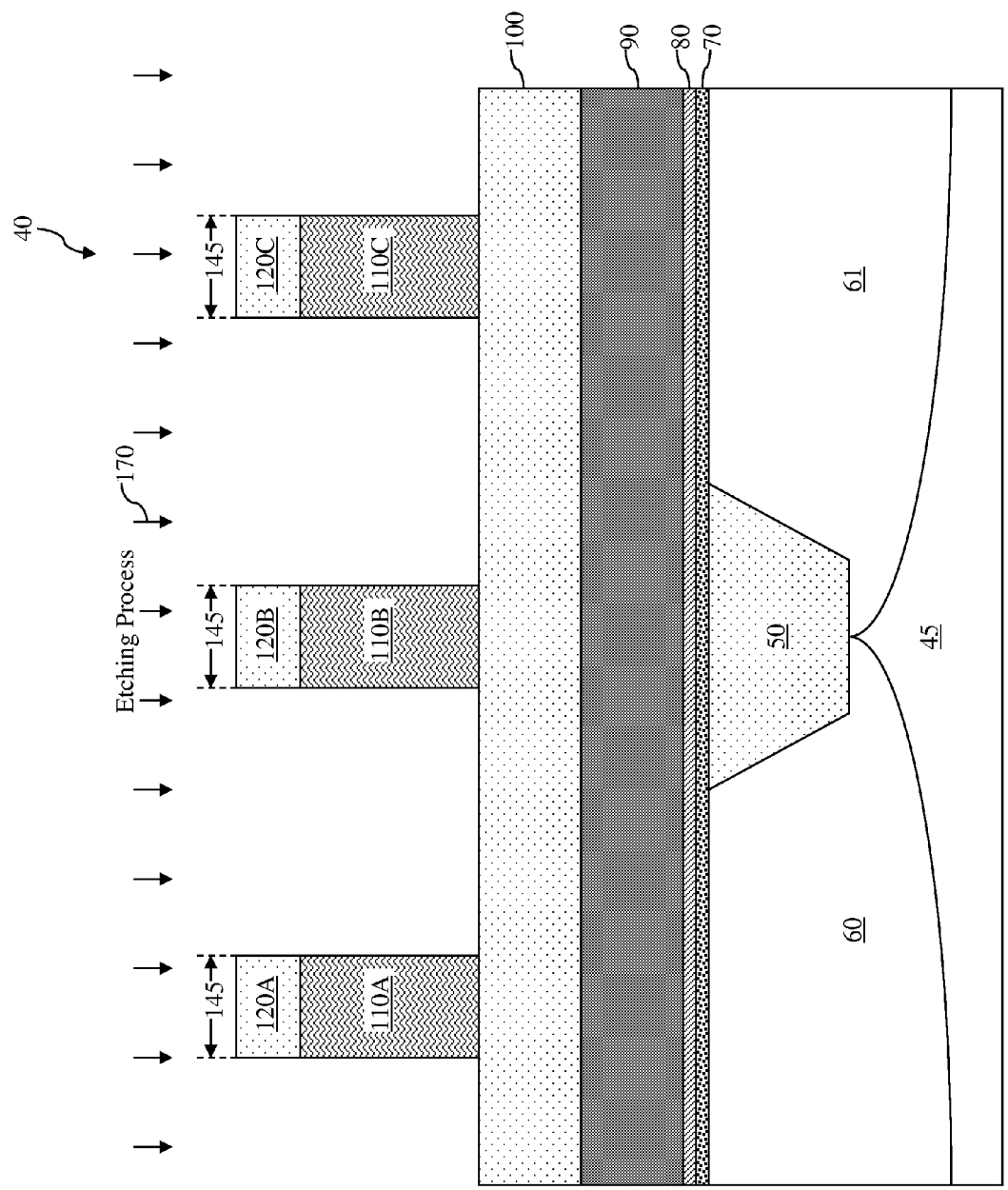

Referring now to FIG. 4, the photoresist portions 130A-130C are removed using a photoresist removal process known in the art, such as a stripping process or an ashing process. Thereafter, an etching process 170 (also referred to as a patterning process) is performed on the semiconductor device 40. The etching process 170 is a dry etching process and uses a highly passivated etchant gas with a heavy molecular weight component. The molecular weight may be in a range from about 32 to about 96. In an embodiment, the etchant of the etching process 170 includes $SO_2$ and $HeO_2$ with a mixing ratio in a range from about 1:1 to about 1:5. A process temperature at an Electrode-chuck is in a range from about 40 degrees Celsius to about 70 degrees Celsius. In other embodiments, the etchant may include $CO_2$, $Cl_2$, Ar, HBr, or an NR gas (which is a mixture of Ar and $O_2$). The etching process 170 may also have a process pressure in a range from about 1 mili Torr (mT) to about 10 mT, and a process power in a range from about 10 Watts to about 1000 Watts.

The sacrificial components 120A-120C serve as etching masks during the etching process 170, and unprotected portions of the anti-reflective layer 110 are etched away. The remaining portions of the anti-reflective layer 110 now become anti-reflective components 110A, 110B, and 110C.

The material compositions for the sacrificial layer 120 and the anti-reflective layer 110 are chosen such that they have an extremely high etching selectivity (measured by ratios of etching rates) during the etching process 170. For example, the etching selectivity may be higher than about 10, and as high as about 100. Such high etching selectivity helps ensure that the anti-reflective layer 110 retains the width 145 of the sacrificial components 120A-120C during the etching process 170. The high etching selectivity also affords the sacrificial components 120A-120C sufficient etching margin, meaning that the sacrificial components 120A-120C will not be completely consumed before the etching of the anti-reflective layer 110 is complete. Furthermore, the highly passivated heavy molecular weight etchant of the etching process 170 helps keep the sidewalls of the etched anti-reflective components 110A-110C smooth and straight. In other words, undesired lateral etching can be substantially prevented or reduced, thereby also helping the anti-reflective components 110A-110C to retain the width 145 of the sacrificial components 120A-120C.

In addition, the high etching selectivity between the layers 120-110 and the highly effective etchant of the etching process 170 make "line twisting" defects much less likely to occur. Line twisting defects tend to occur when the stacks of etched layers and their etching masks thereabove become too tall, which may result in these stacks being shifted or toppled during etching. Here, the high etching selectivity means that the sacrificial components 120A-120C need not be as thick/tall, and the highly passivated etchant substantially prevents lateral etching, which both reduce the likelihood of line twisting during etching.

From the above discussions, it can be seen that the present disclosure involves using separate layers to address the topography variation issue and the CD-defining issue. More specifically, the anti-reflective layer 110 is used to address the topography variation issue through a diluting effect (as a result of having increased thickness), and the sacrificial layer 120 is used to fix the CD size of a transistor. Since each of these layers 110 and 120 is designed and implemented for their own specific purposes, both the topography variation and the CD-definition issues can be addressed very well. In comparison, many traditional fabrication processes attempt to use the same layer to both solve the topography variation issue and to define a CD size of a transistor. Consequently, neither of these issues are adequately addressed under traditional fabrication processes.

Figure 5:
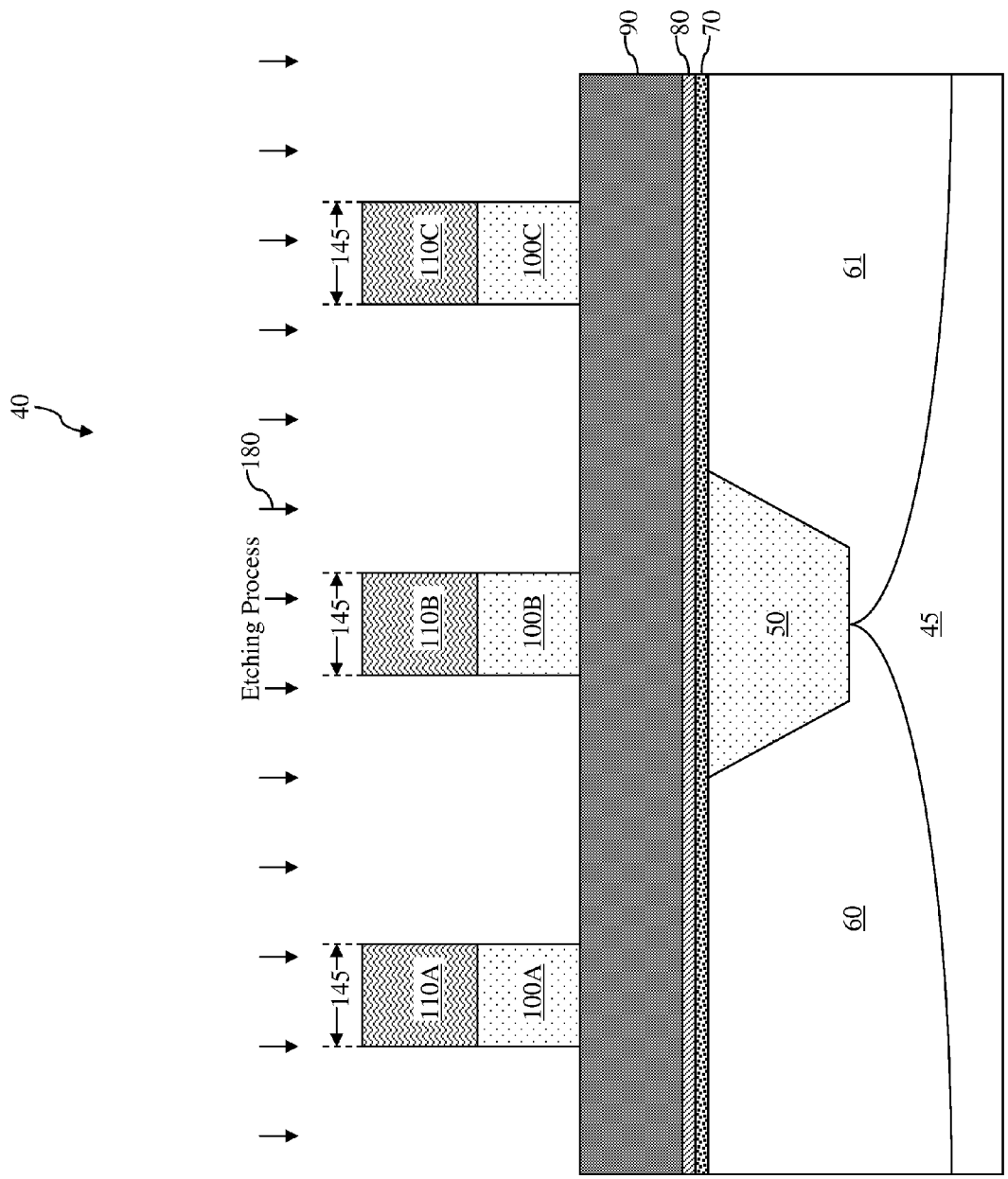

Referring now to FIG. 5, an etching process 180 (also referred to as a patterning process) is performed on the semiconductor device 40. The etching process 180 is a dry etching process and uses a fluorine-containing plasma as an etchant. In one embodiment, the etchant includes $CF_3$ and He with about a 1:2 ratio. In another embodiment, the etchant includes $CF_4/CHF_3$. The etching process 180 has a temperature at an Electrode-chuck that is in a range from about 40 degrees Celsius to about 70 degrees Celsius. The etching process 180 may also have a process pressure in a range from about 1 mili Torr (mT) to about 10 mT, and a process power in a range from about 10 Watts to about 1000 Watts.

The sacrificial components 120A-120C and the anti-reflective components 110A-110C serve as etching masks during the etching process 180, and unprotected portions of the hard mask layer 100 are etched away. The remain portions of the hard mask layer 100 now become hard mask components 100A, 100B, and 100C.

Also, as the etching process 180 is performed, the sacrificial components 120A-120C are etched away, and the anti-reflective components 110A-110C are substantially etched away or consumed as well. In an embodiment, all of the sacrificial components 120A-120C, and about ⅓ to about ⅔ of the anti-reflective components are substantially etched away by the time the etching process 180 is finished. Here, the relatively high thickness of the anti-reflective layer 110 helps maintain a sufficient etching margin during the etching process 180.

In the embodiment where the sacrificial layer 120 includes an organic material, the hard mask components 100A-100C can be trimmed using a trimming process similar to that described above. The trimming process fine tunes the width of the hard mask components 100A-100C, which should be slightly less than the width 145 after the trimming. In any case, the width of the hard mask components 100A-100C is used to set the CD size for a transistor device below, regardless if that width is substantially equal to the width 145 of the sacrificial components in one embodiment (where the sacrificial layer 120 includes a thin dielectric material), or slightly less than the width 145 of the sacrificial components in another embodiment (where the sacrificial layer 120 include an organic material).

Figure 6:
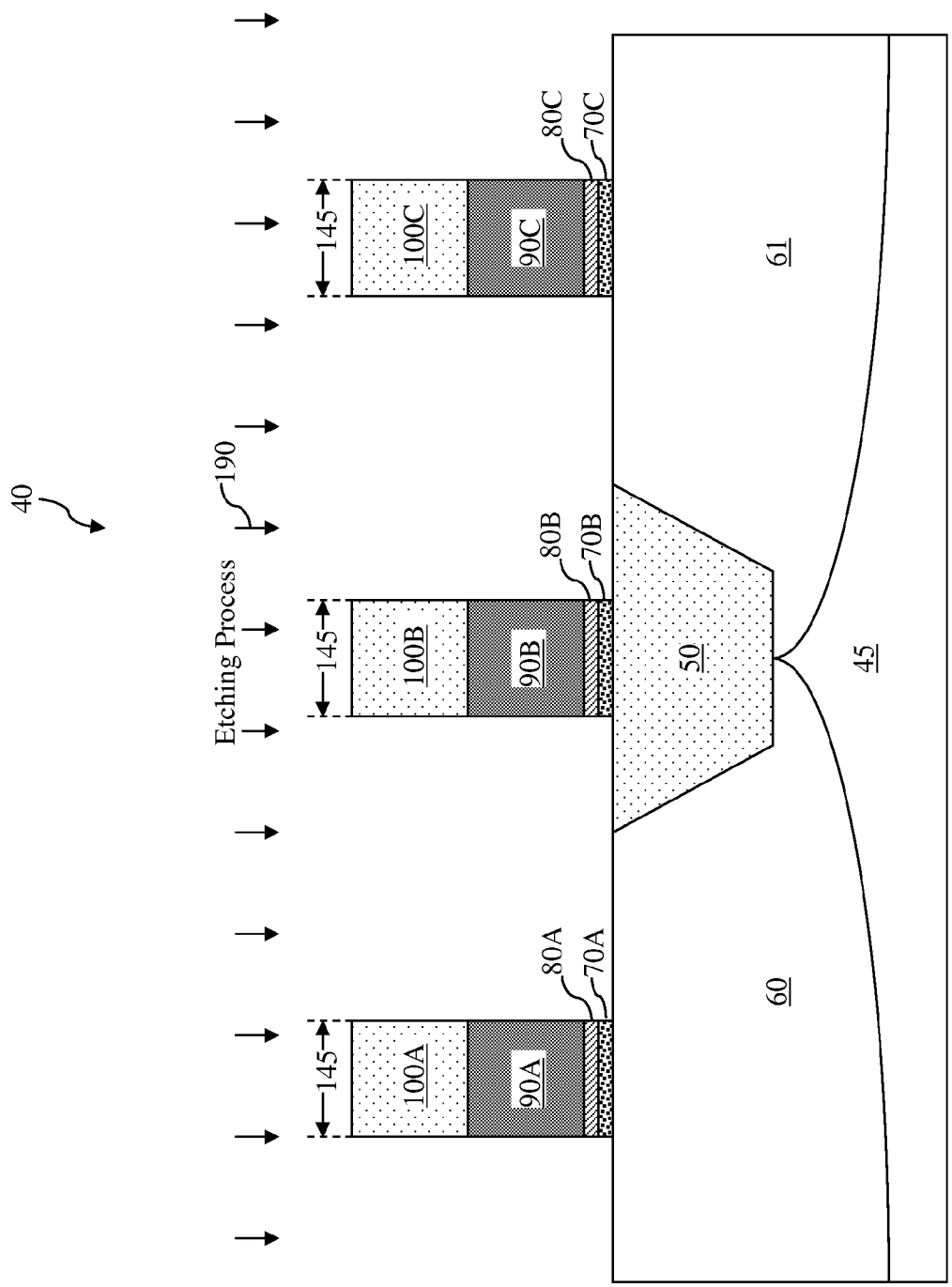

Referring now to FIG. 6, the remaining portions of the anti-reflective components 110A-110C are removed, and an etching process 190 (also referred to as a patterning process) is performed on the semiconductor device 40. Using the hard mask components 100A-100C as etching masks, unprotected portions of the polysilicon layer 90 are etched away. The remaining portions of the polysilicon layer 90 now become polysilicon components 90A, 90B, and 90C. The polysilicon components 90A-90C also serve as dummy gate electrodes in a gate-last or a gate replacement process. Therefore, the polysilicon components 90A-90C may also be referred to as dummy polysilicon gate electrodes 90A-90C. These dummy polysilicon gate electrodes 90A-90C each have the width 145, which will be substantially equal to the channel length (CD) in the embodiment shown.

Had the topography variation issue not been properly addressed by the thick anti-reflective layer 110 and the CD size not been fixed by the sacrificial layer 120, the dummy polysilicon gate electrode 90B may have a width that is smaller than the other dummy polysilicon gate electrodes 90A and 90C, because the isolation structure 50 is taller than other areas of the substrate 45. Thus, CD uniformity would not have been achieved, thereby leading to problems such as gate filling (described later) and/or variations in transistor currents (drain currents) and voltages (threshold voltages). Here, the use of the thick anti-reflective layer 110 and the sacrificial layer 120 sufficiently address these issues discussed above, and therefore the dummy polysilicon gate electrode 90B has substantially the same size as the other dummy polysilicon gate electrodes 90A and 90C. In other words, CD uniformity is much improved.

The conductive layer 80 and the high-k dielectric layer 70 are also etched using the hard mask components 100A-100C as etching masks, thereby forming conductive components 80A-80C and high-k dielectric components 70A-70C underneath the dummy polysilicon gate electrode components 90A-90C.

Figure 7:
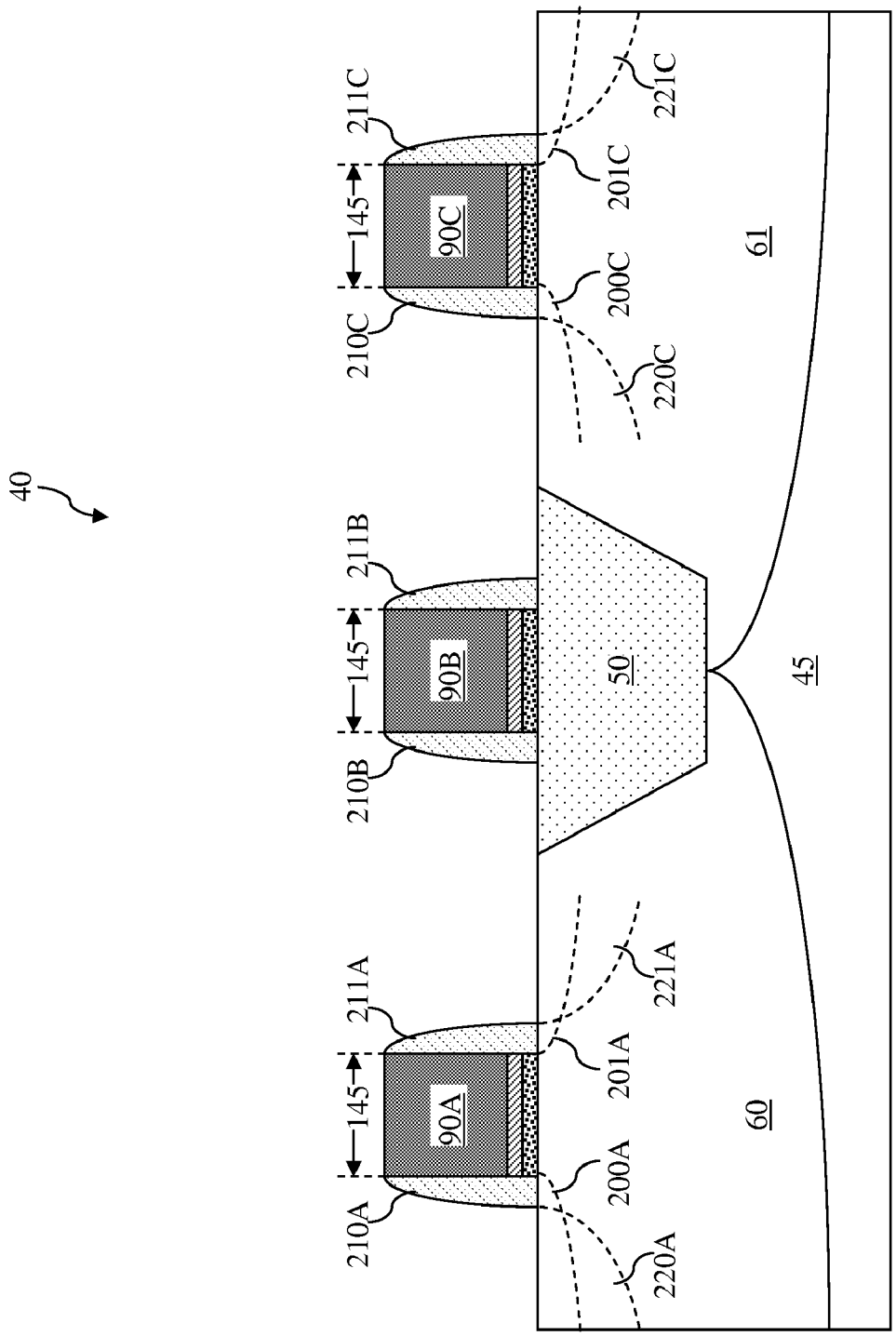

Referring now to FIG. 7, lightly doped source/drain regions 200A-201A are formed in the doped well 60 and on opposite sides of the dummy polysilicon gate electrode 90A, and lightly doped source/drain regions 200C-201C are formed in the doped well 61 and on opposite sides of the dummy polysilicon gate electrode 90C. The lightly doped source/drain regions 200A-201A and 200B-201B are formed using an ion implantation process or a diffusion process known in the art. No lightly doped source/drain regions are formed below the dummy polysilicon gate electrode 90B.

Thereafter, gate spacers 210A and 211A are formed on sidewalls of the dummy polysilicon gate electrode 90A, gate spacers 210B and 211B are formed on sidewalls of the dummy polysilicon gate electrode 90B, and gate spacers 210C and 211C are formed on sidewalls of the dummy polysilicon gate electrode 90C. The gate spacers 210A-210C and 211A-211C are formed using a deposition process and an etching process (for example, an anisotropic etching process) known in the art. The gate spacers 210A-210C and 211A-211C include a suitable dielectric material such as silicon nitride, silicon oxide, silicon carbide, silicon oxy-nitride, or combinations thereof.

Thereafter, heavily doped source/drain regions 220A-221A are formed in the doped well 60 and on opposite sides of the dummy polysilicon gate electrode 90A, and heavily doped source/drain regions 220C-221C are formed in the doped well 61 and on opposite sides of the dummy polysilicon gate electrode 90C. The heavily doped source/drain regions 220A-221A and 220C-221C are formed using an ion implantation process or a diffusion process known in the art. The heavily doped source/drain regions 220A-221A and 220C-221C have heavier dopant concentrations than the lightly doped source/drain regions 200A-201A and 200C-

201C. No heavily doped source/drain regions are formed below the dummy polysilicon gate electrode 90B. Since the dopants cannot penetrate through the spacers 210A-210C and 211A-211C, the heavily doped source/drain regions 220A, 221A, 220C, and 221C are formed to be self-aligned with the spacers 210A, 211A, 210C, and 211C, respectively.

Figure 8:
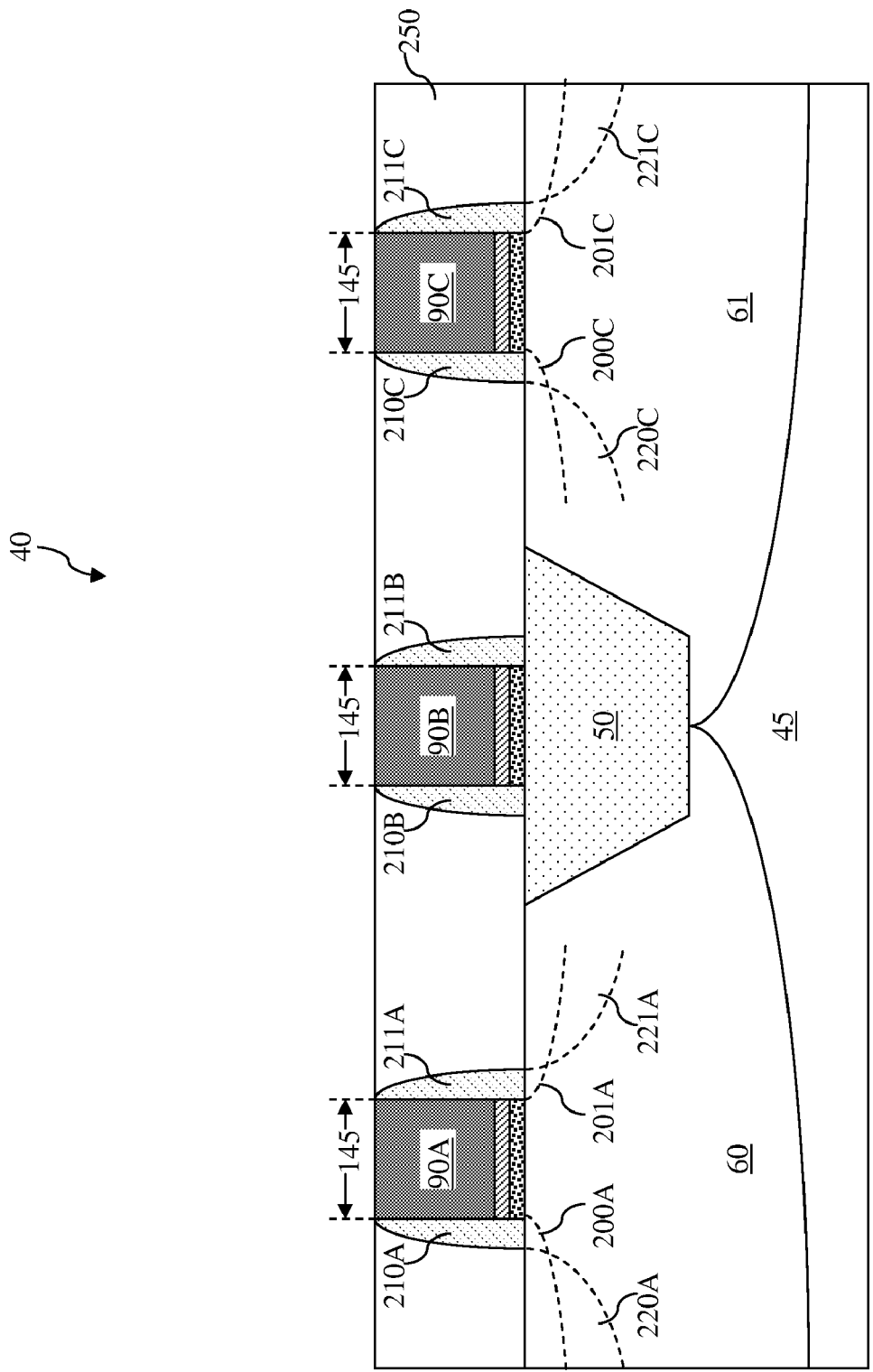

Referring now to FIG. 8, an inter-layer (or inter-level) dielectric (ILD) layer 250 is formed over the substrate 45. The ILD layer 250 may be formed by CVD, high density plasma CVD, spin-on, sputtering, or other suitable methods. In an embodiment, the ILD layer 250 includes silicon oxide. In other embodiments, the ILD layer 250 may include silicon oxy-nitride, silicon nitride, or a low-k material. The ILD layer 250 is formed to surround the dummy polysilicon gate electrodes 90A-90C as well as the gate spacers 210A-210C and 211A-211C.

Thereafter, a chemical-mechanical-polishing (CMP) process is performed on the ILD layer 250 to flatten the top surface and to expose the dummy polysilicon gate electrodes 90A-90C. Following the CMP process, the top surfaces of the dummy polysilicon gate electrodes 90A-90C are substantially co-planar with the top surface of the ILD layer 250. Although not illustrated, one or more annealing processes are performed on the semiconductor device 40 to activate the source and drain regions. These annealing processes may be performed before or after the CMP process.

Figure 9:
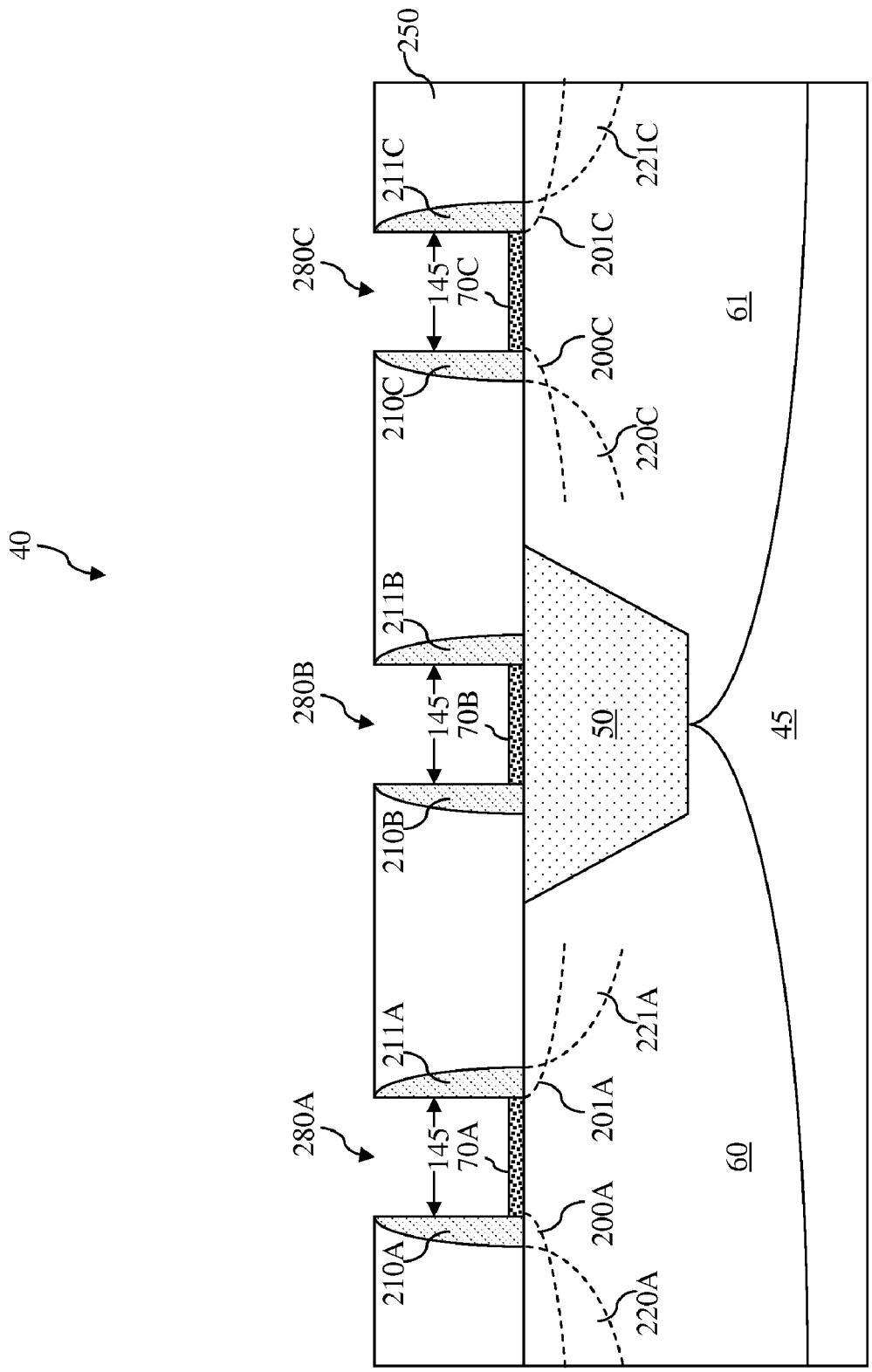

Referring now to FIG. 9, the dummy polysilicon gate electrodes 90A-90C are removed, thereby forming openings (or trenches) 280A-280C in place of the dummy polysilicon gate electrodes 90A-90C, respectively. The dummy polysilicon gate electrodes 90A-90C and the conductive components 80A-80C therebelow may be removed in a wet etching or a dry etching process known in the art, while the rest of the layers of the semiconductor device 40 remain substantially un-etched, including the gate spacers 210A-210C and 211A-211C and the ILD layer 250. This is performed in accordance with a "gate last" process. Note that the openings or trenches 280A-280C still maintain the width 145, which is substantially equal to the critical dimension.

Figure 10:
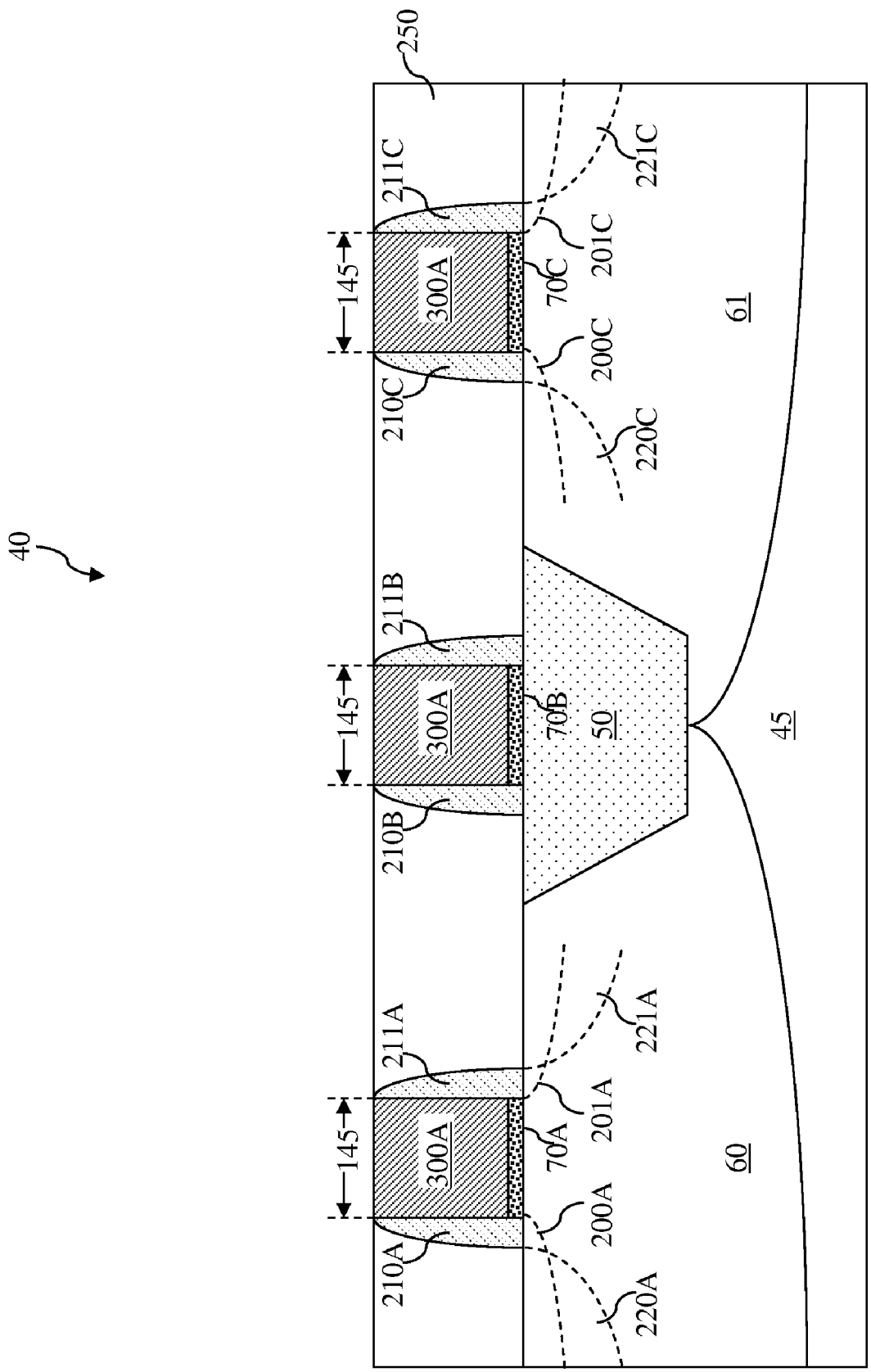

Referring to FIG. 10, metal gate electrodes 300A-300C are formed within the trenches 280A-280C, respectively, and over the high-k gate dielectric layers 70A-70C. The metal gate electrodes 300A-300C each include a work function metal, which may be N-type and includes Ti, Al, Ta, $ZrSi_2$, or TaN, or P-type and includes Mo, Ru, Ir, Pt, PtSi, MoN, or WNx. The work function metal has a respective range of work functions values associated therein. The work function metal tunes a work function of its respective transistor so that a desired threshold $V_t$ voltage is achieved. The metal gate electrodes 300A-300C also each include a fill metal portion that serves as the main conductive portion of the gate electrode. The fill metal portions may include tungsten, aluminum, copper, or combinations thereof. For the sake of simplicity, the work function metals and the fill metal portions are not separately drawn.

Described above is a gate-last process flow. It is understood that the various aspects of the present disclosure can also be applied to a high-k last process flow. In that case, an oxide dielectric layer is formed in place of the high-k dielectric layer 70 originally. The oxide dielectric layer is removed along with the dummy poly gate electrodes 300A-300C. A high-k gate dielectric layer is then formed in the openings 280A-280C before the metal gate electrodes are formed in these openings. In both the gate-last process flow and the high-k last process flow, the gate electrodes 300A-300C all have substantially equal widths or critical dimensions. In other words, very good CD uniformity can be achieved.

Therefore, the embodiments of the present disclosure offers advantages, it being understood that different embodiments may offer different advantages, and that no particular advantage is required for all embodiments. One of the other advantages is that both the topography variation issue and the CD-definition issue can be sufficiently addressed. As discussed above, many traditional fabrication methods attempt to use a single layer to resolve both the topography variation issue and the CD-definition issue. As a result, neither of these issues is adequately resolved.

In comparison, the present disclosure uses two separate layers to deal with these two issues. A thick anti-reflective layer 110 is used to dilute the topography variation effects (such as step height). Meanwhile, a sacrificial layer 120 having a very high etching selectivity with the anti-reflective layer 110 is used to fix the CD size. Therefore, the CD size can be accurately defined, and the topography variation effects can be minimized at the same time. Also, the use of the highly passivated etchant gas with the heavy molecular weight component reduces undesired lateral etching and keeps the sidewall profile of the anti-reflective layer 110 smooth and straight while it is etched. This also helps the CD uniformity.

Having good CD uniformity may be advantageous for the gate-replacement process flow described above. In the gate-replacement process, the dummy polysilicon gate electrodes are removed to form openings, and the openings are filled with metal gate electrodes. If CD uniformity is not achieved, then some of these openings (such as an opening located above an STI device) may become too small to be filled, or will be filled but may contain air bubbles. This is particularly true as device sizes become smaller and smaller. Here, substantial CD uniformity is achieved in spite of topography variations. Consequently, filling the gate openings with metal is not a problem. Furthermore, good CD uniformity obtained by the present disclosure can help minimize undesired variations of drain currents or threshold voltages among different transistor devices.

Furthermore, the present disclosure can be easily integrated into existing process flow. Therefore, it does not increase fabrication costs. Also, the present disclosure involve using fewer layers than traditional processes, therefore it saves process time accordingly. In addition, the heavy molecular weight etchant used in the present disclosure (such as $SO_2$) has a very fast etching rate. As an example, it may only take about 15-20 seconds to "open" (or etch through) the anti-reflective layer 110 with a thickness of about 2000 angstroms. In comparison, opening another anti-reflective layer with a traditional etchant may take about 100 seconds. Overall, the present disclosure may save total processing time by about 40-50%. Since processing time is directly related to fabrication costs, the total fabrication costs may be substantially reduced by implementing the processes and materials taught in the present disclosure.

It is understood that additional processes may be performed to complete the fabrication of the semiconductor device 40. For example, these additional processes may include formation of interconnect structures (e.g., lines and vias, metal layers, and interlayer dielectric that provide electrical interconnection to the device including the formed metal gate), deposition of passivation layers, packaging, and dicing. For the sake of simplicity, these additional processes are not described herein.

One of the broader forms of the present disclosure involves a method of fabricating a semiconductor device. The method includes: forming a patternable layer over a substrate; forming a first layer over the patternable layer; forming a second layer over the first layer, the second layer being substantially thinner than the first layer; patterning the second layer with a photoresist mask through a first etching process to form a patterned second layer; patterning the first layer with the patterned second layer through a second etching process to form a patterned first layer, wherein the first and second layers have substantially different etching rates during the second etching process; and patterning the patternable layer with the patterned first layer through a third etching process.

Another of the broader forms of the present disclosure involves a method of fabricating a semiconductor device. The method includes: forming a hard mask layer over a substrate; forming an anti-reflective layer over the hard mask layer, the anti-reflective layer having a first thickness; forming a sacrificial layer over the anti-reflective layer, the sacrificial layer including one of: a dielectric material having a second thickness, and a nitrogen-containing organic material having a third thickness, wherein the second and third thicknesses are both substantially smaller than the first thickness, and wherein a ratio of the first thickness to the second thickness is several times greater than a ratio of the first thickness to the third thickness; forming a patterned photoresist layer over the sacrificial layer; performing a first etching process on the sacrificial layer using the patterned photoresist layer as a first etching mask, thereby forming a patterned sacrificial layer; performing a second etching process on the anti-reflective layer using the patterned sacrificial layer as a second etching mask, thereby forming a patterned anti-reflective layer, wherein an etching selectivity between the sacrificial layer and the anti-reflective layer with respect to the second etching process is greater than about 10; and patterning the hard mask layer with the patterned anti-reflective layer to form a patterned hard mask layer.

Still another of the broader forms of the present disclosure involves a method of fabricating a semiconductor device. The method includes: forming a polysilicon layer over a substrate; forming a hard mask layer over the polysilicon layer; forming an anti-reflective layer over the hard mask layer, the anti-reflective layer containing carbon and hydrogen, wherein a carbon content is greater than a hydrogen content by at least about 10 times; forming a sacrificial layer over the anti-reflective layer, the sacrificial layer being substantially thinner than the first layer, the sacrificial layer containing one of: a dielectric material and a nitrogen-containing organic material; performing a first patterning process on the sacrificial layer using a photoresist mask, the first patterning process using a fluorine-containing plasma as an etchant; performing a second patterning process on the anti-reflective layer using the patterned sacrificial layer, the second patterning process using an etchant gas that includes a component with a molecular weight in a range from about 32 to about 96, wherein the anti-reflective layer and the sacrificial layer have substantially different etching rates during the second patterning process; and performing a third patterning process on the hard mask layer using the patterned anti-reflective layer; and performing a fourth patterning process on the polysilicon layer using the patterned hard mask layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further, the PMOS device may be disposed in a deep n-well pocket for isolating the device.

What is claimed is:

1. A method of fabricating a semiconductor device, comprising:
    forming a patternable layer over a substrate, wherein the patternable layer includes a polysilicon gate electrode layer;
    forming a first layer over the patternable layer;
    forming a second layer over the first layer, the second layer being substantially thinner than the first layer;
    patterning the second layer with a photoresist mask through a first etching process to form a patterned second layer;
    patterning the first layer with the patterned second layer through a second etching process to form a patterned first layer, wherein the first and second layers have substantially different etching rates during the second etching process; and
    patterning the patternable layer with the patterned first layer through a third etching process.

2. The method of claim 1, wherein the patterned second layer includes a plurality of components, each of these components having a dimension that defines a critical dimension.

3. The method of claim 2, further including performing a trimming process to the second layer to fine tune the critical dimension.

4. The method of claim 1, wherein the first layer is at least about ten times thicker than a variation in topography of the substrate.

5. The method of claim 1, wherein:
    the second layer is several times thinner than the first layer; and
    the etching rates between the first and second layers differ by at least ten times.

6. The method of claim 1, wherein:
    the patternable layer includes a hard mask material;
    the first layer includes an anti-reflective material; and
    the second layer includes one of: a dielectric material, and a nitrogen-containing organic material.

7. The method of claim 6, the first layer contains both carbon and hydrogen, and wherein:
    the carbon concentration is at least ten times higher than the hydrogen concentration;
    a refractive index of the first layer is greater than about 1; and
    an extinction coefficient of the first layer is lower than about 0.5.

8. The method of claim 1, wherein the second etching process is a dry etching process and uses an etchant that contains $SO_2$.

9. A method of fabricating a semiconductor device, comprising:
    forming a hard mask layer over a substrate;
    forming an anti-reflective layer over the hard mask layer, the anti-reflective layer having a first thickness;
    forming a sacrificial layer over the anti-reflective layer, the sacrificial layer including one of a dielectric material having a second thickness, and a nitrogen-containing organic material having a third thickness, wherein the second and third thicknesses are both substantially smaller than the first thickness, and wherein a ratio of the first thickness to the second thickness is several times greater than a ratio of the first thickness to the third thickness;

forming a patterned photoresist layer over the sacrificial layer;

performing a first etching process on the sacrificial layer using the patterned photoresist layer as a first etching mask, thereby forming a patterned sacrificial layer;

performing a second etching process on the anti-reflective layer using the patterned sacrificial layer as a second etching mask, thereby forming a patterned anti-reflective layer, wherein an etching selectivity between the sacrificial layer and the anti-reflective layer with respect to the second etching process is greater than about 10; and patterning the hard mask layer with the patterned anti-reflective layer to form a patterned hard mask layer.

10. The method of claim 9, wherein:
the first thickness is in a range from about 1000 angstroms to about 2000 angstroms;
the second thickness is in a range from about 50 angstroms to about 200 angstroms; and
the third thickness is in a range from about 400 angstroms to about 500 angstroms.

11. The method of claim 9, wherein the anti-reflective layer has a carbon concentration in a range from about 65% to about 85%, and a hydrogen concentration in a range from about 3% to about 6.5%, a refractive index in a range from about 1.4 to about 1.7, and an extinction coefficient in a range from about 0.2 to about 0.4.

12. The method of claim 9, wherein the second etching process is a dry etching process and uses an etchant having a heavy molecular weight component with a molecular weight being in a range from about 32 to about 96.

13. The method of claim 9, wherein the second etching process uses an etchant that includes $SO_2$ and $HeO_2$ with a mixing ratio in a range from about 1:1 to about 1:5.

14. The method of claim 9, wherein the patterned sacrificial layer includes at least one component whose size defines a critical dimension of a transistor.

15. The method of claim 9, further including:
before the forming the hard mask layer, forming a dielectric layer over the substrate and forming a polysilicon layer over the dielectric layer;
patterning the polysilicon layer with the patterned hard mask layer to form dummy polysilicon electrodes;
removing the dummy polysilicon electrodes, thereby forming openings in place of the dummy polysilicon electrodes; and
thereafter filling the openings with metal electrodes.

16. A method of fabricating a semiconductor device, comprising:
forming a polysilicon layer over a substrate;
forming a hard mask layer over the polysilicon layer;
forming an anti-reflective layer over the hard mask layer, the anti-reflective layer containing carbon and hydrogen, wherein a carbon content is greater than a hydrogen content by at least about 10 times;
forming a sacrificial layer over the anti-reflective layer, the sacrificial layer being substantially thinner than the first layer, the sacrificial layer containing one of: a dielectric material and a nitrogen-containing organic material;
performing a first patterning process on the sacrificial layer using a photoresist mask, the first patterning process using a fluorine-containing plasma as an etchant;
performing a second patterning process on the anti-reflective layer using the patterned sacrificial layer, the second patterning process using an etchant gas that includes a component with a molecular weight in a range from about 32 to about 96, wherein the anti-reflective layer and the sacrificial layer have substantially different etching rates during the second patterning process; and
performing a third patterning process on the hard mask layer using the patterned anti-reflective layer; and
performing a fourth patterning process on the polysilicon layer using the patterned hard mask layer.

17. The method of claim 16, wherein the polysilicon layer is patterned into dummy gate electrodes by the fourth patterning process, and further including:
before the forming the polysilicon layer, forming a gate dielectric layer over the substrate;
forming doped source/drain regions in the substrate on opposite sides of the dummy gate electrodes;
forming an inter-layer dielectric (ILD) structure over the substrate, the ILD structure at least partially surrounding the dummy gate electrodes; and
forming openings in the ILD structure by removing the dummy gate electrodes; and thereafter filling the openings with metal gate electrodes.

18. The method of claim 16, wherein:
the anti-reflective layer has a thickness that is in a range from about 1000 angstroms to about 2000 angstroms;
if the sacrificial layer includes the dielectric material, a thickness of the sacrificial layer is in a range from about 50 angstroms to about 200 angstroms; and
if the sacrificial layer includes the nitrogen-containing organic material, a thickness of the sacrificial layer is in a range from about 400 angstroms to about 500 angstroms.

19. The method of claim 16, wherein:
the carbon content and the hydrogen content of the anti-reflective layer are measured with respect to weight; and
the anti-reflective layer has: a molecular weight that is in a range from about 4000 to about 5000, a refractive index that is greater than about 1, and an extinction coefficient that is less than about 0.5, the refractive index and the extinction coefficient being measured with respect to a 193 nanometer process.

20. The method of claim 16, wherein:
the first and third patterning processes each use a fluorine-containing plasma as an etchant; and
the second patterning process uses an etchant that includes $SO_2$ and $HeO_2$, a ratio of the $SO_2$ to the $HeO_2$ being less than about 1:1.

* * * * *